United States Patent
Ali

(10) Patent No.: US 7,232,748 B2
(45) Date of Patent: Jun. 19, 2007

(54) BARC/RESIST VIA ETCHBACK PROCESS

(75) Inventor: Abbas Ali, Plano, TX (US)

(73) Assignee: Texas Instruments Incoporated, Dallas, TX (US)

( * ) Notice: Subject to any disclaimer, the term of this patent is extended or adjusted under 35 U.S.C. 154(b) by 0 days.

(21) Appl. No.: 10/897,864

(22) Filed: Jul. 22, 2004

(65) Prior Publication Data

US 2006/0019498 A1    Jan. 26, 2006

(51) Int. Cl.
    *H01L 21/4763*    (2006.01)
(52) U.S. Cl. .................. 438/618; 438/622; 438/624; 438/636; 438/637
(58) Field of Classification Search ............. None
    See application file for complete search history.

(56) References Cited

U.S. PATENT DOCUMENTS

| | | | |
|---|---|---|---|
| 6,448,177 B1 * | 9/2002 | Morrow et al. ............. | 438/638 |
| 6,781,216 B2 * | 8/2004 | Nakamura .................. | 257/637 |
| 6,861,347 B2 * | 3/2005 | Lee et al. ................... | 438/622 |
| 2002/0173143 A1 * | 11/2002 | Lee et al. ................... | 438/637 |
| 2003/0001273 A1 * | 1/2003 | Steiner et al. .............. | 257/760 |
| 2004/0127016 A1 * | 7/2004 | Hoog et al. ................ | 438/637 |
| 2004/0137711 A1 * | 7/2004 | Deguchi ..................... | 438/622 |

* cited by examiner

*Primary Examiner*—Duy-Vu N. Deo
(74) *Attorney, Agent, or Firm*—Jacqueline J Garner; W. James Brady, III; Frederick J. Telecky, Jr.

(57) ABSTRACT

A BARC or other sacrificial fill layer etch comprises a selective etch chemistry of $Ar/O_2/CO$. The BARC etch may be used in a via-first dual damascene method. After via (116) pattern and etch, a BARC/sacrificial fill layer (120) is deposited to fill the via (116) and coat the IMD (110). The excess sacrificial fill layer (120) material over the IMD (110) is removed using the $Ar/O_2/CO$ etch. A trench resist pattern (125) is formed over the BARC layer (120). During the main trench etch, portions of sacrificial fill layer (120) remain in the via to protect the etch-stop (104) at the bottom of the via (116).

8 Claims, 2 Drawing Sheets

BARC/RESIST VIA ETCHBACK PROCESS

FIELD OF THE INVENTION

The invention is generally related to the field of forming integrated circuits and more specifically to an organic bottom-antireflective coating (BARC) or other sacrificial fill layer etch that may be used in, for example, a dual damascene process flow for forming interconnect structures.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects and from traditional silicon-dioxide-based dielectrics to low-k dielectrics, such as organo-silicate glass (OSG). Semiconductor fabrication processes that work with copper interconnects and newer low-k dielectrics are still needed. As compared to the traditional subtractive plasma dry etching of aluminum, suitable copper etches for a semiconductor fabrication environment are not readily available. To overcome the copper etch problem, damascene processes have been developed.

In a damascene process, the IMD (intrametal dielectric) is formed first. The IMD is then patterned and etched to form a trench for the interconnect line. If connection vias have not already been formed, a dual damascene process may be used. In a dual damascene process, the trench is formed in the IMD and a via is etched in the (interlevel dielectric) ILD for connection to lower interconnect levels. The barrier layer and a copper seed layer are then deposited over the structure. The barrier layer is typically tantalum nitride or some other binary transition metal nitride. The copper layer is then electrochemically deposited using a seed layer over the entire structure. The copper is then chemically-mechanically polished (CMP'd) to remove the copper over the IMD, leaving copper interconnect lines and vias. A metal etch is thereby avoided.

Patterning and etching in a dual damascene process can be problematic due to the necessity of forming both the trench and the via before filling either with copper. Both trench-first and via-first processes are being developed. In a via-first process, the via is patterned and etched followed by the trench patterning. The bottom of the via needs to be protected during the trench etch to prevent etching of the via etch-stop layer. A BARC (bottom-antireflective coating) via fill has been proposed for protecting the bottom of the via during the trench etch. A spin-on organic BARC is often used to reduce substrate reflectivity during resist pattern. This BARC may be used to protect the bottom of the via. Methods for effectively integrating a BARC fill in a dual damascene process without creating additional processing problems are desired. Moreover, as new technologies demand ever smaller critical dimensions (CDs) in semiconductor devices, CD control becomes more important. Semiconductor processes must be controllable so that the small CDs can be reproduced.

SUMMARY OF THE INVENTION

The invention is a sacrificial fill layer etch. The etch comprises a selective etch chemistry comprising $Ar/O_2/CO$. The etch may, for example, be used in a via-first dual damascene method. After via pattern and etch, the via is over-filled with a sacrificial fill layer. The sacrificial fill layer is then etched-back using the $Ar/O_2/CO$ chemistry to remove the excess material. Then, the trench may be patterned and etched.

An advantage of the invention is providing a more controllable sacrificial fill layer etch.

This and other advantages will be apparent to those of ordinary skill in the art having reference to the specification in conjunction with the drawings.

DETAILED DESCRIPTION OF THE EMBODIMENTS

Figure 1A:
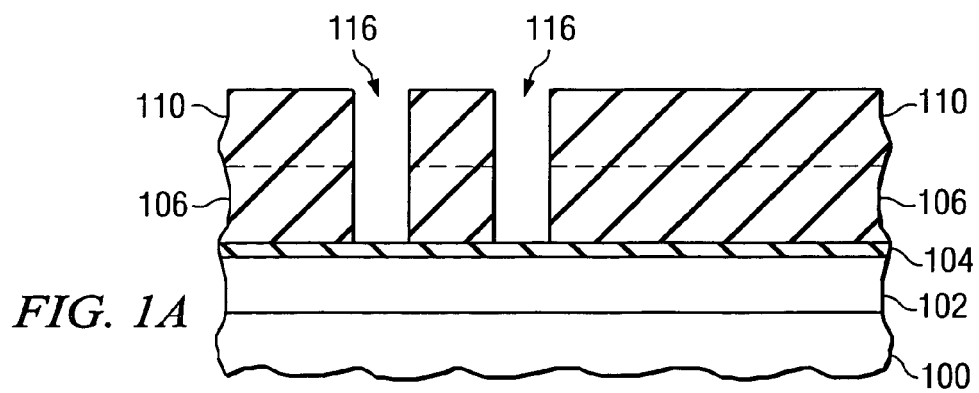
FIGS. 1A–1G are cross-sectional diagrams of a via-first dual damascene interconnect according to the invention at various stages of fabrication.

In a via-first dual damascene process, it is desirable to protect the via etch-stop layer during the trench etch. A BARC needed for trench pattern can also be used to fill the via. Due to severe via topography, uniform BARC fill is very difficult. For example, when a thinner BARC fill is used, the vias in a less dense area may be filled while vias in a more dense area are only partially filled. The non-uniformity makes the trench pattern difficult and inconsistent across the via topography.

To improve the trench pattern, a thick BARC fill is used to overfill the vias even in a dense via region. However, this makes the trench etch more difficult due to the long BARC etch and BARC non-uniformity across the via topography. Depending on the etch chemistry used, this extended etch can increase the trench CD and/or remove too much OSG in the more dense areas due to thinner BARC on the top surface. For example, a $CF_4/O_2/Ar$ BARC etch has a relatively low selectivity to OSG (i.e., ~1:1.5) and results in a significant portion of the OSG being removed in the dense area. On the other hand, a $N_2/O_2$ BARC etch has a high selectivity to OSG (i.e., >20:1) but the extended BARC etch increases the CD on the trench.

An $Ar/O_2/N_2$ BARC etch offers good selectivity and good CD control. Unfortunately, it also leads to resist poisoning. When low-k dielectrics such as OSG are used for the IMD and ILD, a problem known as resist poisoning can occur. Resist poisoning occurs during a patterning step such as via pattern or trench pattern. It is a result of the interaction between a DUV (deep ultra-violet) resist and low-k films. Resist poisoning causes poor resist sidewall profiles, resist scumming, large CD variations, and requires a large resist exposure dose. Furthermore, the required resist exposure dose to achieve the target CD becomes too high and varies with film aging. Another problem that can occur with the above chemistry is excessive recess of the BARC within the via due to high etch rate characteristics. This results in a poor process margin for the trench etch.

The invention replaces the $N_2$ with CO to eliminate resist poisoning and provide superior etchback results. An $Ar/O_2/CO$ chemistry is used in conjunction with low ion energy plasma conditions. It minimizes the recess (overetch) of the BARC inside the vias and accordingly, improves the trench pattern and etch process margin.

A preferred embodiment of the invention will now be described in conjunction with a via-first dual damascene process using an organo-silicate glass (OSG) as the dielectric. It will be apparent to those of ordinary skill in the art that the invention may be applied to other sacrificial fill layer etch processes to control CD, such as FSG (fluorine-doped silicate glass) dual damascene trench etch, via or contact hole etch as well as other dual damascene or single damascene etches. The invention may be applied to etch BARC materials, resins, other polymers, and/or resists used to fill the vias. For example, in a dual damascene process with bilayer or trilayer resists where the pattern is in the top layer of resist, the invention may be applied to etch the bottom layer of the bilayer resist or the middle and bottom layers of a trilayer resist to preserve CDs.

Referring to FIG. 1A, a semiconductor body 100 is processed through the formation of a first interconnect level 102. First interconnect level 102 may in fact be Metal 1 or it may be any metal interconnect level other than the upper most interconnect layer. An etch-stop layer 104 is formed over first interconnect level 102. In the preferred embodiment etch-stop layer 104 comprises silicon nitride. Alternative materials for etch-stop layer 104, such as SiC, are known in the art.

An ILD layer 106 is deposited over etch-stop layer 104. An IMD 110 is deposited over the ILD layer 106. If desired, an etch-stop layer may be formed between ILD 106 and IMD 110. This etch-stop layer may also comprise silicon nitride. ILD 106 and IMD 110 comprise OSG in the preferred embodiment. Alternative dielectric materials, such as FSG, are known in the art.

Still referring to FIG. 1A, vias 116 are etched in IMD 110 and ILD 106. A resist mask (not shown) is typically used to pattern and etch vias. A hardmask may be optionally deposited on the top of the IMD layer. Appropriate etch chemistries are known in the art. For example, in the case of OSG, the etch of IMD 110 and ILD 106 may comprise $C_4F_8/N_2/Ar$. The etch chemistry will of course depend on the dielectric (106/110), etch-stop, and hardmask materials used.

Figure 1B:
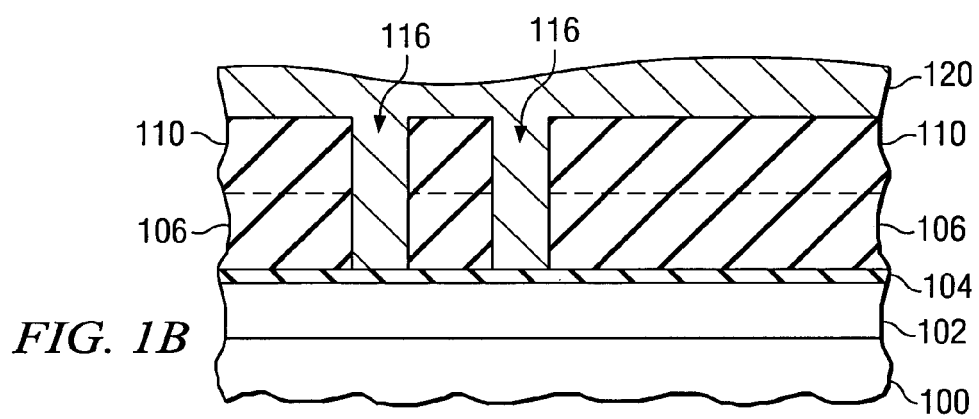

Referring to FIG. 1B, a sacrificial fill layer 120 is deposited to fill vias 116. Preferably, a single thick BARC layer is deposited to form layer 120. Other materials such as resins, other polymers, or resists may be used for sacrificial fill layer 120. The thickness of the sacrificial fill layer 120 is highly dependent upon the via CD, via depth, and via density. For example, a BARC thickness in the range of 2400 Å may be needed to achieve a complete via fill across the via topography. Suitable BARC materials are known in the art.

The excess portion of sacrificial fill layer 120 is removed using an etch chemistry comprising $Ar/O_2/CO$, as shown in FIG. 2C Sacrificial fill layer 120 is removed from over IMD 110 and may be minimally recessed within vias 116. The etch uses a low ion energy plasma. For example, RF power during plasma etch can be 100–300 W. The low energy plasma combined with the $Ar/O_2/CO$ chemistry eliminates the resist poisoning that occurs with an $Ar/O_2/N_2$ chemistry. It also minimizes the recess inside the vias to improve the trench patterning process margin.

An exemplary process is given below:

| | |
|---|---|
| Pressure: | 50 mTorr |
| Power: | 100 Watt |
| Ar flow: | 0–100 sccm |
| CO flow: | 100 sccm |
| $O_2$ flow: | 10 sccm |
| Chuck temp.: | 20° C. |

Figure 1C:
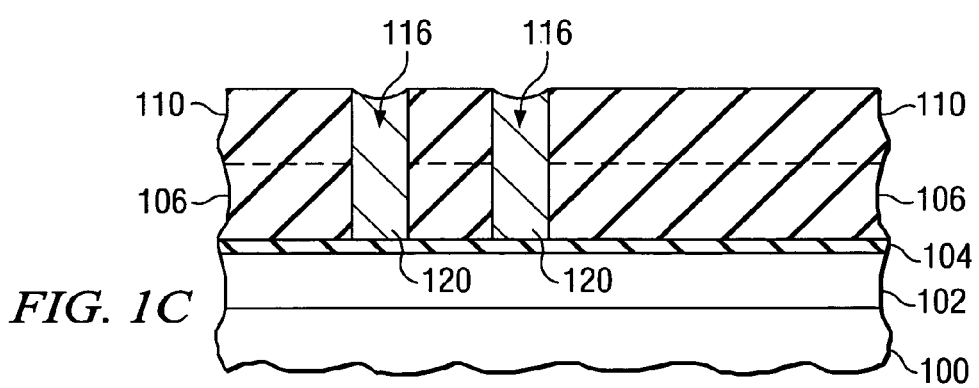

The etch continues until the sacrificial layer 120 is cleared over exposed portions of IMD 110, as shown in FIG. 1C.

After the etch, portions of sacrificial fill layer 120 remain in the vias to protect the etch-stop layer 104 during the main trench etch.

Figure 1D:
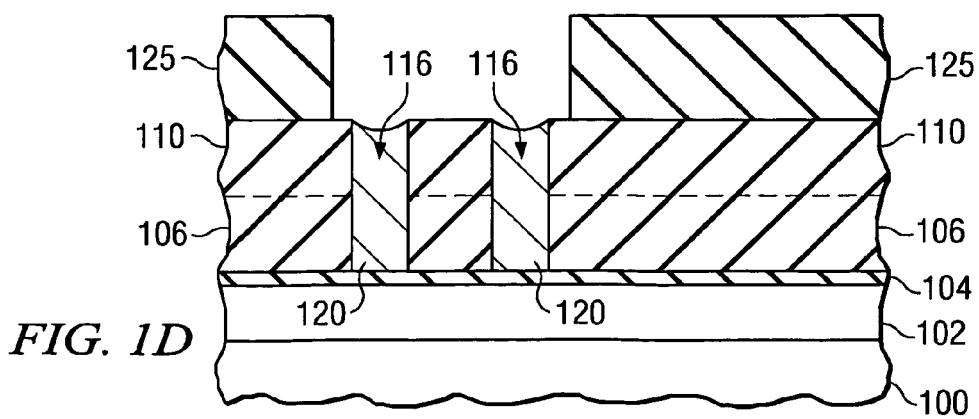
Figure 1E:
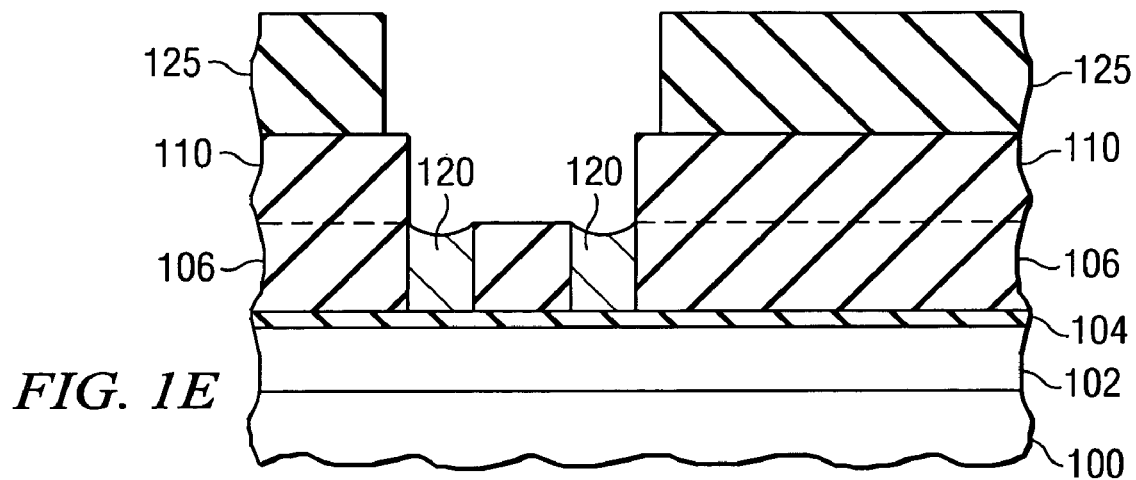

Referring to FIG. 1D, a trench pattern 125 is formed on the sacrificial fill layer 120. Trench pattern 125 may or may not include an additional BARC layer. Various methods are being developed for patterning the trenches and vias in a dual damascene process. For example, the trench pattern 125 may include both a resist mask and a hardmask. The trench etch is then performed to remove the exposed portions of IMD 110, as shown in FIG. 1E. Appropriate etch chemistries are known in the art. For example, in the case of OSG, the etch chemistry may comprise $C_4F_8/N_2/Ar$.

Figure 1F:
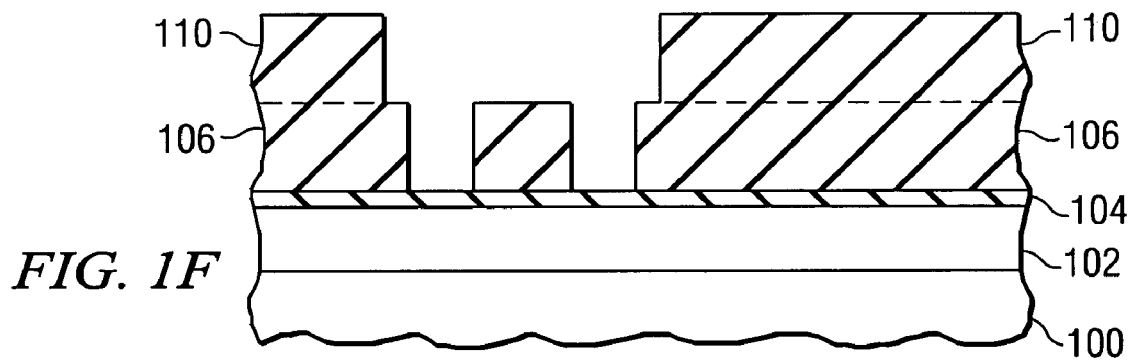
Figure 1G:
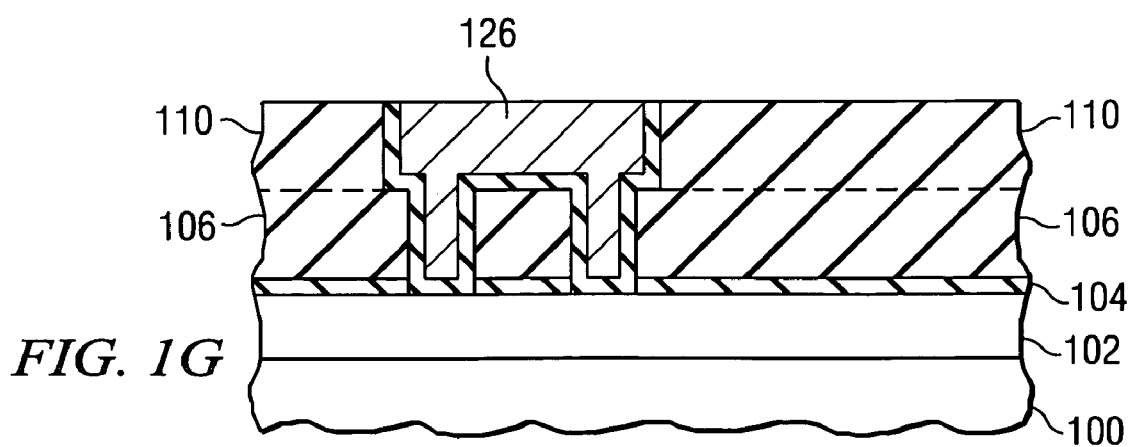

After the trench etch, the trench resist pattern 125 and any remaining portions of sacrificial fill layer 120 are removed as shown in FIG. 1F. Additional clean processes may be performed at this time.

Next, the via 116 is opened by etching the remaining portion of etchstop layer 104 at the bottom of via 116. Then, the desired barrier layers and copper fill are formed and CMP'd back to form second interconnect layer 126, as shown in FIG. 2G. For example, a TaN barrier may be deposited in trench 124 and via 116 followed by a copper seed layer. Using an electroplating process, the copper fill layer is formed. Then, the copper is chemically-mechanically polished until it is relatively planar with the top of IMD 110. The above process may then be repeated to form additional metal interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of fabricating an integrated circuit, comprising the steps of:
    providing a semiconductor body having a dielectric layer at a surface thereof;
    etching a via in said dielectric layer;
    depositing a fill layer to overfill said via;
    etching said fill layer to remove an excess portion of said fill layer over said dielectric layer using an etch chemistry comprising Ar, $O_2$, and CO;
    after etching said fill layer to remove the excess portion, forming a trench pattern over said fill layer;
    etching a trench in said dielectric layer; and
    removing said trench pattern and said fill layer.

2. The method of claim 1, wherein said fill layer comprises a bottom anti-reflective coating material.

3. The method of claim 1, wherein said fill layer comprises a resin.

4. The method of claim 1, wherein said fill layer comprises a polymer.

5. The method of claim 1, wherein said fill layer comprises a resist material.

6. The method of claim 1, wherein said etching step comprises a plasma etch performed using a low ion energy plasma that can be obtained by an RE power in the range of 100–300 W.

7. A method of fabricating an integrated circuit, comprising the following steps performed in order:
    providing a semiconductor body having an organo-silicate-glass (OSG) layer at a surface thereof;
    forming a via pattern over said OSG layer;

etching a via in said OSG layer;
removing said via pattern;
depositing a bottom anti-reflective coating (BARC) layer to overfill said via;
etching said BARC layer to remove an excess portion of said BARC layer over said dielectric layer using an etch chemistry comprising Ar, $O_2$, and CO;
forming a trench pattern over said BARC layer;
etching a trench in said OSG layer; and
removing said trench pattern and said BARC layer.

8. The method of claim 7, wherein said etching step comprises a plasma etch performed using a low ion energy that can be obtained by an RF power in the range of 100–300 W.

* * * * *